United States Patent
Steinle et al.

(10) Patent No.: US 7,421,603 B2
(45) Date of Patent: Sep. 2, 2008

(54) METHOD FOR MONITORING THE OPERATING READINESS OF AT LEAST ONE MEMORY ELEMENT ASSIGNED TO AN ELECTRONIC UNIT

(75) Inventors: Claus Steinle, Stuttgart (DE); Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 410 days.

(21) Appl. No.: 10/502,103

(22) PCT Filed: Jan. 17, 2003

(86) PCT No.: PCT/DE03/00128

§ 371 (c)(1),
(2), (4) Date: Mar. 9, 2005

(87) PCT Pub. No.: WO03/060922

PCT Pub. Date: Jul. 24, 2003

(65) Prior Publication Data
US 2005/0157569 A1 Jul. 21, 2005

(30) Foreign Application Priority Data
Jan. 19, 2002 (DE) ................... 102 01 958

(51) Int. Cl.
*G06F 13/14* (2006.01)
(52) U.S. Cl. .................. 713/340; 713/300; 713/310; 713/320; 713/321; 713/322; 713/323; 713/324; 713/330; 340/636.19; 324/426; 324/433; 320/136; 320/149

(58) Field of Classification Search .................. 713/300, 713/310, 320–324, 330, 340; 324/426, 433; 320/136, 149
See application file for complete search history.

(56) References Cited

U.S. PATENT DOCUMENTS

| 5,539,910 | A | 7/1996 | Brueckmann et al. |
| 6,148,418 | A | 11/2000 | Wang et al. |
| 6,314,307 | B1 | 11/2001 | Charron |
| 6,810,338 | B2 * | 10/2004 | Mercke et al. ............... 702/63 |
| 6,950,683 | B2 * | 9/2005 | Hunt .......................... 455/572 |
| 7,082,288 | B2 * | 7/2006 | Hosoi ......................... 455/78 |
| 7,225,353 | B1 * | 5/2007 | Wong ......................... 713/340 |

FOREIGN PATENT DOCUMENTS

| DE | 33 10 585 | 10/1984 |
| DE | 691 18 420 | 12/1996 |
| DE | 196 01 804 | 7/1997 |
| EP | 0 049 462 | 4/1982 |
| EP | 0 604 270 | 6/1994 |
| EP | 1 003 290 | 5/2000 |
| JP | 10-134558 | 5/1998 |

* cited by examiner

*Primary Examiner*—Abdelmoniem Elamin
(74) *Attorney, Agent, or Firm*—Kenyon & Kenyon LLP

(57) ABSTRACT

A method for monitoring the operating readiness of memory elements which are assigned to an electronic unit, an engine control unit for example. Furthermore, an electronic unit for executing the method and a computer program, as well as a computer program product are described. In the method described, a supply voltage of the electronic unit is monitored to ensure error-free operation of the memory elements.

14 Claims, 1 Drawing Sheet

METHOD FOR MONITORING THE OPERATING READINESS OF AT LEAST ONE MEMORY ELEMENT ASSIGNED TO AN ELECTRONIC UNIT

FIELD OF THE INVENTION

The present invention relates to a method for monitoring the operating readiness of at least one memory element that is assigned to an electronic unit, and an electronic unit for executing the method. The present invention also relates to a computer program for executing the method according to the present invention.

BACKGROUND INFORMATION

Flash EPROMs, for example, are used for the storage of program code in electronic units such as, for example, engine control units. It is also common in modern controllers to integrate flash memory elements to execute programs as quickly as possible. However, the integrated flash memory element is substantially more expensive than an external flash memory IC (integrated circuit) which, however, is slower in comparison with the former. For this reason, external (stand-alone) flash memory ICs are used for program sections which do not affect the performance of the overall system.

This creates the problem that different technologies are used to manufacture the different ICs for the computers and the memories which therefore run on different operating voltages. Even on the computer, depending on the technology, the operating voltages for the computer kernel and the operating voltage of the flash memory may be different.

Generally, the operating voltage of the flash memory is higher than that of the computer kernel. However, program execution is ensured only when the operating voltage for the memory in which the program to be executed is stored and the operating voltage for the computer kernel are within a specified tolerance zone.

Low voltage recognition of the operating voltages and associated error handling are necessary for a supply voltage dip of the engine control unit.

A method and a device for monitoring an electronic computing unit are described in German Patent Application No. DE 196 01 804. In the method described, in the event of an interruption in the supply voltage and following initialization of the computing unit, a reset signal is transmitted from a voltage monitoring device to the computing unit and, after the signal is received, the operating state of the computing unit is checked by comparing a content of a volatile memory cell with a fixedly predefined code. A decision regarding the further control sequence is made based on this check. After triggering a reset signal, the content of a volatile memory cell is compared with a predefined code. Each reset signal thus triggers a check during which a test is made on whether the content of the volatile memory is still completely present. This makes it possible to differentiate between interruptions in the voltage supply which cause errors in the computing unit and such interruptions in the voltage supply which do not cause errors in the computing unit.

Depending on the size of a dip in the supply voltage it may occur that the highest operating voltage is no longer sufficient for part of the flash memory, but the other operating voltages for the other parts of the flash memory and the computer kernel are still within the specified tolerance. Normal program execution is thus no longer possible under these circumstances because it is assumed that the entire flash memory must always be available.

A low voltage on the operating voltage is normally detected via a threshold value using hysteresis. However, a prerequisite for this is that the threshold value is higher than the memory's minimum operating voltage, but also lower than the lowest operating voltage caused by interruptions. Such an analysis is indeed no longer possible when the flash memory's operating voltage has a very narrow tolerance.

SUMMARY

An example method according to the present invention may be used for monitoring the operating readiness of at least one memory element that is assigned to an electronic unit. The operating readiness of the memory element or memory elements is checked by monitoring the electronic unit's supply voltage. The error-free operation of the entire electronic unit may be ensured in this way.

The example method according to the present invention may make it possible in particular to monitor multiple memory elements, external as well as internal elements, which require different operating voltages, and makes it also possible to make an assertion about which of the different memory elements are still operational at a certain supply voltage.

Instead of monitoring the operating voltage or operating voltages of the at least one memory element, the supply voltage of the electronic unit, e.g., an engine controller, is thus monitored. This makes it possible to detect the shortfall of the operating voltage at the at least one memory element in a timely manner.

The analysis of the threshold value shortfall, by using a provided computing unit for example, may take place in different ways, depending on the accuracy and response time requirements and also as a function of the overall concept for the engine controller.

One approach provides that the supply voltage is initially divided down. The supply voltage divided down may then be preferably cyclically measured using an analog-digital converter (ADC), for example, cyclically read in (polling) at a general purpose input of the computing unit and/or analyzed at an interrupt input of the electronic computing unit.

Another approach provides that the supply voltage is entered into a comparator whose output signal is analyzed for monitoring the supply voltage. The analysis takes place, for example, in that the output signal is cyclically read in (polling) at a general purpose input of the electronic computing unit and/or analyzed at an interrupt input of the electronic computing unit.

An embodiment of the present invention provides that the operating voltage of the at least one memory element is additionally monitored.

If, for example, multiple memory elements are provided which require operating voltages of varying intensity, then, in the event of detection of a low voltage at one of the memory elements, the computing unit may only process program code from memory elements to which an adequate operating voltage is applied. This makes it possible, in a motor vehicle for example, to continue to ensure a limited functionality (e.g., at the start). As soon as it is detected that the operating voltage is in the specified range for all memory elements or for all parts of a memory element, e.g., of a flash memory element, the entire program code may be re-utilized.

An example electronic unit according to the present invention, e.g., an engine control unit, is operated using a certain supply voltage. At least one memory element is assigned to the unit. Memory elements may be flash memory elements but also other known memory elements; memory elements of a different type may also be used. The electronic unit is designed in such a way that, for monitoring the readiness for operation of the at least one memory element, monitoring of the electronic unit's supply voltage is provided.

A suitable device is used for monitoring that, based on the monitored electronic unit's supply voltage, allows the determination as to which of the memory elements is operational. The reliable operation of the entire electronic unit may thus be ensured.

The electronic unit preferably has a computing unit, e.g., a microprocessor or a controller.

An example embodiment of the present invention provides an analog-digital converter (ADC) for monitoring the supply voltage. An alternative design provides a comparator for monitoring the supply voltage.

A design is of course possible in which a comparator as well as an analog-digital converter are provided, so that the different methods for monitoring the supply voltage may be combined in any way to achieve a desired redundancy.

An example computer program according to the present invention includes program code means to execute an above-described method. This method is executed on a computer or a suitable computing unit. The computing unit is preferably an electronic computing unit in an electronic unit according to the present invention.

An example computer program product according to the present invention provides that the program code means are stored on a computer readable data medium.

It shall be understood that the above-mentioned features and the features which will be explained below are usable not only in the combination cited, but also in other combinations or alone without leaving the scope of the present invention.

BRIEF DESCRIPTION OF THE DRAWINGS

The present invention is illustrated in the drawing based on exemplary embodiments and is explained in greater detail in the following with reference to the drawing.

DETAILED DESCRIPTION OF EXAMPLE EMBODIMENTS

Figure 1:
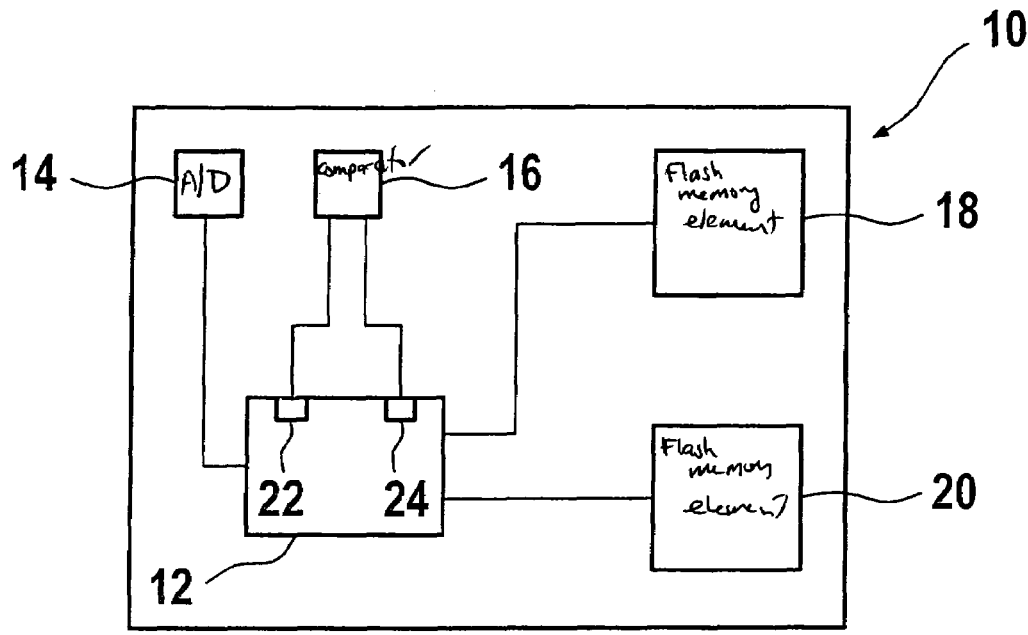
FIG. 1 shows an example embodiment of the electronic unit according to the present invention in a schematic representation.

An electronic unit according to an example embodiment of the present invention, an engine control unit 10 in this case, is schematically illustrated in FIG. 1. Shown here are an electronic computing unit 12, namely a controller 12, an analog-digital converter (ADC) 14, a comparator 16, a first memory element 18, and a second memory element 20. Memory elements 18 and 20 are flash memory elements 18 and 20 in this case.

Controller 12 has a general purpose input 22 and an interrupt input 24. The required operating voltage of controller 12 differs from the required operating voltages of first and second memory elements 18 and 20, which in turn require operating voltages of different intensity.

The supply voltage of engine control unit 10 is used for monitoring the operating readiness of both memory elements 18 and 20. This offers various possibilities. At first, the supply voltage of engine control unit 10 may be divided down, and the supply voltage divided down may then be measured using ADC 14, read in at general purpose input 22 and/or analyzed at interrupt input 24.

Alternatively or also additionally, the supply voltage may be entered into comparator 16 whose output signal is then preferably cyclically read in at general purpose input 22 for analysis or analyzed at interrupt input 24.

Figure 2:
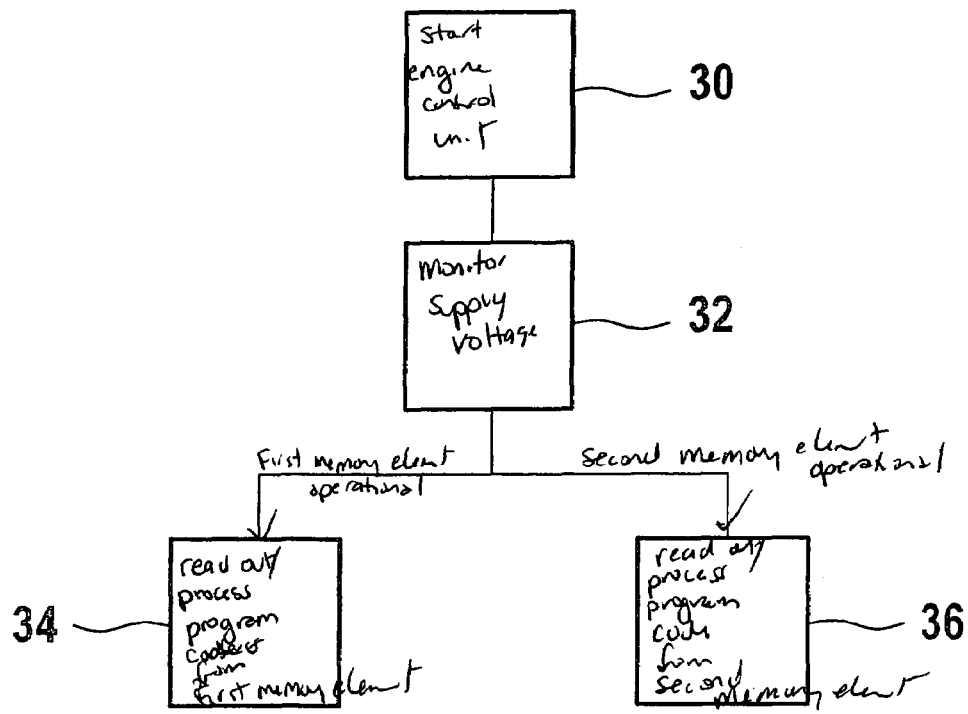
FIG. 2 shows an example embodiment of the method according to the present invention in a flow chart.

A method according to the present invention is represented in FIG. 2 in a flow chart. In a step 30, engine control unit 10 is started up. For monitoring the operating readiness of both memory elements 18 and 20, the supply voltage of engine control unit 10 in monitored in a step 32. If, based on the supply voltage, it is detected that, for example, just first memory element 18 is operational, controller 12 will only read out and process program code from this memory element 18 in a step 34 until the operating voltage of second memory element 20 is also in the specified range again.

If monitoring does not yield a value below threshold, then program code from both memory elements 18 and 20 is continued to be processed in a step 36.

A particular advantage of the method according to the present invention lies in the fact that the demands on the supply voltage of engine control unit 10 are lower than on the operating voltages of memory elements 18 and 20 since temporary voltage dips may be bypassed, e.g., at the start of the motor vehicle, in particular when the battery is weak, and/or during operation.

What is claimed is:

1. A method for monitoring an operating readiness of two memory elements assigned to an electronic unit, comprising:
   monitoring a supply voltage of the electronic unit;
   operating each of the memory elements using a respective operating voltage that is different compared to the supply voltage, each of the operating voltages being in a specified range so that the respective memory element is operational; and
   detecting, based on the monitoring of the supply voltage, that the operating voltage of one of the two memory elements is not in the specified range, and processing program code from the other of the two memory elements whose operating voltage is in the specified range;
   wherein the monitoring of the supply voltage includes initially dividing down the supply voltage.

2. The method as recited in claim 1, wherein the monitoring of the supply voltage includes cyclically measuring the divided down supply voltage using an analog-digital converter.

3. The method as recited in claim 1, wherein the monitoring of the supply voltage includes cyclically reading in the divided down supply voltage at a general purpose input of an electronic computing unit.

4. The method as recited in claim 1, wherein the monitoring of the supply voltage includes analyzing the divided down supply voltage at an interrupt input of an electronic computing unit.

5. The method as recited in claim 2, wherein the monitoring of the supply voltage includes entering the supply voltage into a comparator whose output signal is analyzed.

6. The method as recited in claim 5, wherein the monitoring of the supply voltage includes cyclically reading in the output signal of the comparator at a general purpose input of an electronic computing unit.

7. The method as recited in claim 5 wherein the monitoring of the supply voltage includes analyzing the output signal of the comparator at an interrupt input of an electronic computing unit.

8. A method for monitoring an operating readiness of two memory elements assigned to an electronic unit, comprising:
   monitoring a supply voltage of the electronic unit;

operating each of the memory elements using a respective operating voltage that is different compared to the supply voltage, each of the operating voltages being in a specified range so that the respective memory element is operational;

monitoring the operating voltage of at least one of the memory elements; and detecting, at least based on the monitoring of the supply voltage, that the operating voltage of one of the two memory elements is not in the specified range, and processing program code from the other of the two memory elements whose operating voltage is in the specified range.

9. An electronic unit that is using a supply voltage, comprising:

two memory elements assigned to the electronic unit, each of the memory elements being operated using an operating voltage that is different than the supply voltage, each of the operating voltages being in a respective, specified range so that the respective memory element is operational; and a monitor to monitor the supply voltage, wherein the electronic unit is adapted for detecting, based on the monitoring of the supply voltage, that the operational voltage of one of the two memory elements is no longer in its respective specified range and to responsively cause program code to be processed from the other of the two memory elements whose operating voltage is in its respective specified range;

wherein the monitoring of the supply voltage includes initially dividing down the supply voltage.

10. The electronic unit as recited in claim 9, further comprising:

an electronic computing unit.

11. The electronic unit as recited in claim 9, wherein at least one of the memory elements is a flash memory element.

12. The electronic unit as recited in claim 9, wherein the monitor includes an analog-digital converter to monitor the supply voltage.

13. The electronic unit as recited in claim 9, wherein the monitor includes a comparator to monitor the supply voltage.

14. A computer readable medium having stored thereon instructions executable by a processor, the instructions which, when executed, cause the processor to perform a method for monitoring an operational readiness of two memory elements assigned to an electronic unit, the method resulting in performance of the following steps:

monitoring a supply voltage of the electronic unit;

operating each of the memory elements using a respective operating voltage that is different compared to the supply voltage, each of the operating voltages being in a specified range so that the respective memory element is operational; and detecting, based on the monitoring of the supply voltage, that the operating voltage of one of the two memory elements is not in the specified range, and processing program code from the other of the two memory elements whose operating voltage is in the specified range;

wherein the monitoring of the supply voltage includes initially dividing down the supply voltage.

* * * * *